United States Patent [19]

Bowman et al.

[11] 4,193,539
[45] Mar. 18, 1980

[54] SIGNAL GENERATOR

[75] Inventors: Rodney V. Bowman; Martin H. Francis, both of Wichita, Kans.

[73] Assignee: NCR Corporation, Dayton, Ohio

[21] Appl. No.: 849,383

[22] Filed: Nov. 7, 1977

[51] Int. Cl.² ...................... H03K 23/02; H03K 21/12
[52] U.S. Cl. .......................... 235/92 NG; 235/92 SH; 235/92 PE
[58] Field of Search ............ 235/92 SH, 92 PE, 92 T, 235/92 ST, 92 DM, 92 GT, 92 DB, 92 NG; 328/48, 43; 307/223 R

[56] References Cited

U.S. PATENT DOCUMENTS

| 3,108,228 | 10/1963 | Clapper | 328/43 |
|---|---|---|---|
| 3,585,371 | 6/1971 | Dowling | 235/92 SH |
| 3,691,536 | 9/1972 | Peterson | 235/92 NG |
| 3,716,725 | 2/1973 | Freeman | 328/43 |
| 3,803,587 | 4/1974 | Mead | 235/92 SH |
| 3,931,588 | 1/1976 | Gehweiler | 331/57 |

Primary Examiner—Joseph M. Thesz
Attorney, Agent, or Firm—J. T. Cavender; Albert L. Sessler, Jr.

[57] ABSTRACT

A timing generator which may be used for multiple-cycle controllers is disclosed. A Johnson counter which may have a selectively operable delay interposed between successive stages is utilized with an oscillator and a plurality of multiplexers to provide a plurality of timing pulse train cycles. Circuitry is provided to eliminate spurious output signals from the timing generator.

17 Claims, 13 Drawing Figures

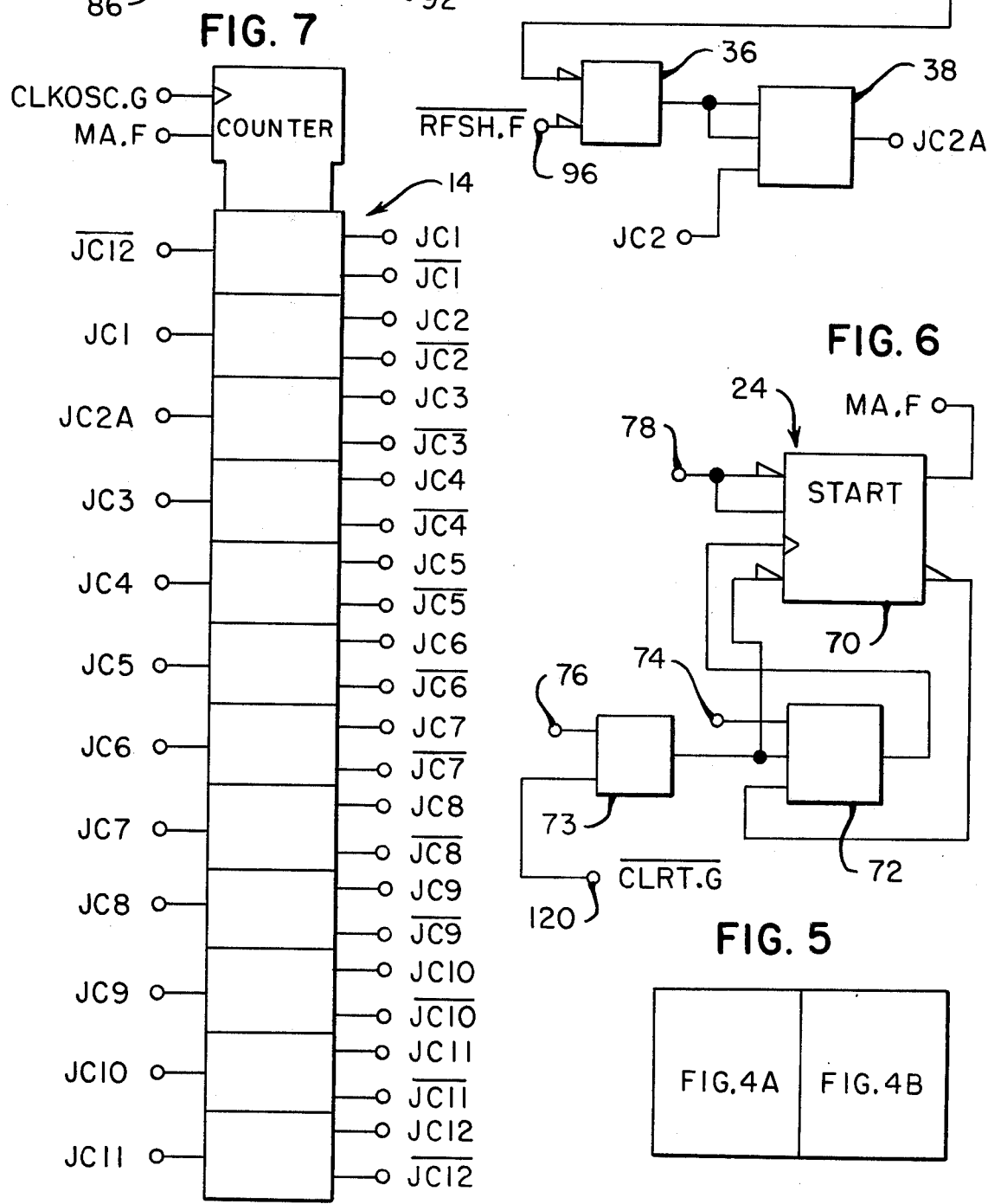

SIGNAL GENERATOR

BACKGROUND OF THE INVENTION

In data processing systems, a plurality of different timing pulse train cycles are often required for different types of operations, and for driving different types of equipment. It would, of course, be possible to provide a separate circuit for each different cycle which is required, but to do this would substantially increase the cost and complexity of the system. A need therefore exists for a device which is capable of producing a multiplicity of different timing cycles, utilizing a substantial proportion of circuitry common to the generation of all of the timing cycles.

SUMMARY OF THE INVENTION

This invention relates to apparatus for producing a plurality of different timing cycles.

In accordance with one embodiment of the invention, a control signal generating means capable of generating a plurality of different timing cycles comprises multi-stage shift register means; means for clocking said multi-stage shift register means; multiplexer means to which a plurality of outputs from various stages of said shift register means are applied; and selection means for controlling said multiplexer means to select desired outputs from the shift register means for application to a utilizing device.

It is accordingly an object of the present invention to provide a novel and efficient apparatus for producing a plurality of different timing cycles.

Another object is to provide an apparatus for producing multiple timing cycles, with different timing for each cycle, using minimum circuitry.

A further object is to provide a circuit which produces multiple cycles, with different timing for each cycle, said circuit including an oscillator, a multi-stage counter, a multiplexer, and a delay which may be selectively applied between successive counter stages so as to produce variable timing cycles.

With these and other objects, which will become apparent from the following description, in view, the invention includes certain novel features of construction and combinations of parts, one form or embodiment of which is hereinafter described with reference to the drawings which accompany and form a part of this specification.

BRIEF DESCRIPTION OF THE DRAWINGS

FIG. 5 is a diagram showing the manner in which FIGS. 4A and 4B are assembled to form a schematic diagram.

FIG. 6 is a schematic diagram of the start flip-flop.

FIG. 7 is a schematic diagram of the counter.

FIG. 8 is a schematic diagram of the oscillator and delay means associated with the counter.

DETAILED DESCRIPTION OF THE PREFERRED EMBODIMENT

Figure 1:
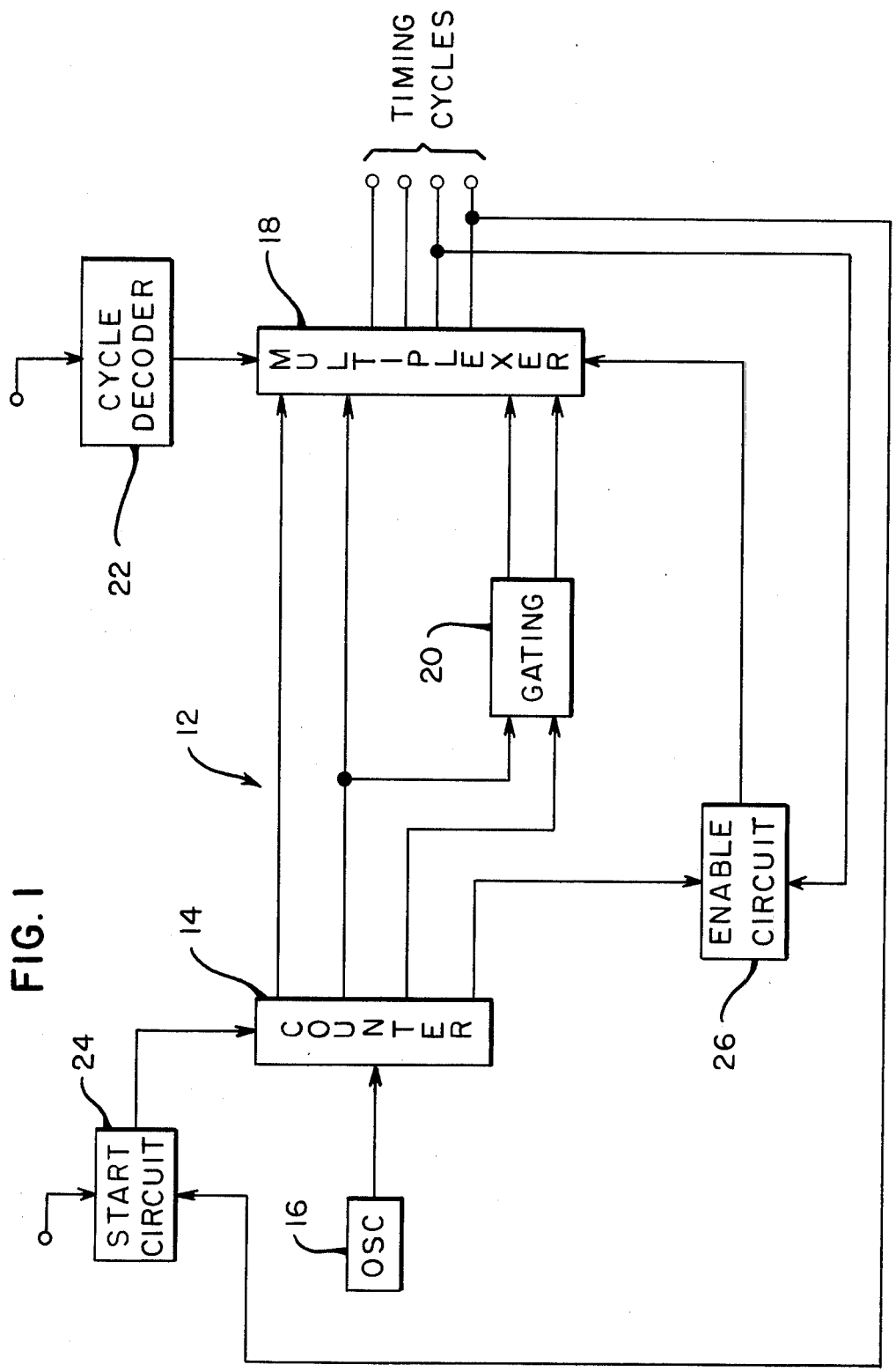
FIG. 1 is a block diagram of the timing generator of the present invention.

Referring to FIG. 1, there is shown a block diagram of a timing generator 12 constructed in accordance with the present invention. The generator 12 includes a counter 14, an oscillator 16 for driving the counter, a multiplexer 18 which receives output signals from the counter 14, the multiplexer having outputs from which the various timing cycles are taken, gating means 20 interposed between the counter 14 and the multiplexer 18, a cycle decoder 22 for controlling the operation of the multiplexer 18, a start circuit 24 for initiating operation of the timing generator, and an enable circuit 26. The functions of these various components will be subsequently described in detail.

Figure 2:
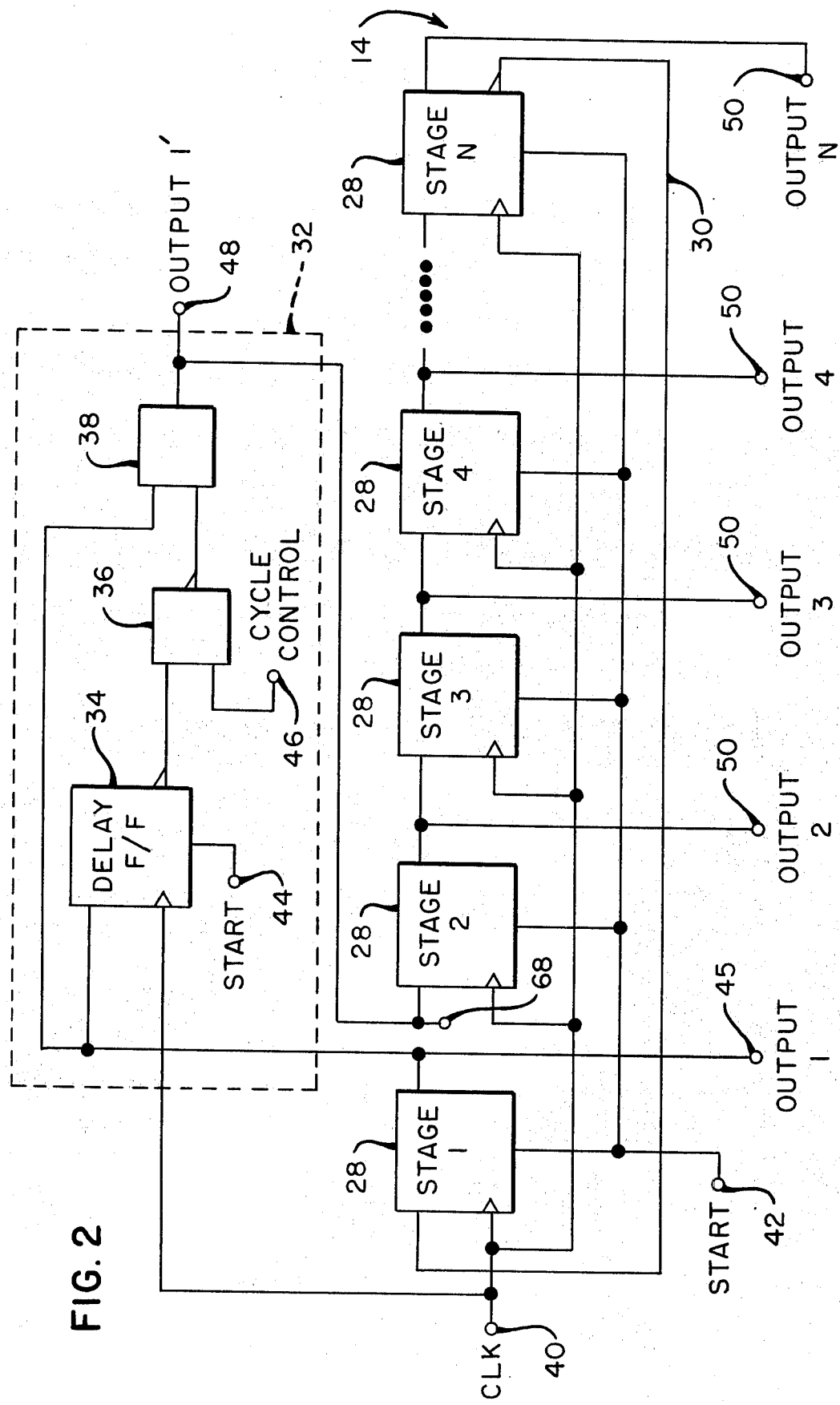
FIG. 2 is a block diagram showing the manner in which a delay means is incorporated into the counter.

The counter 14, shown in greater detail in block form in FIG. 2, is a multi-stage shift register comprising a plurality of stages 28, and is preferably of the twisted ring type, commonly called a Johnson counter, in which the complement output of the final stage is coupled to the input of the first stage by conductor 30. A selectively operable delay means 32 is interposed between two successive stages 28 of the counter 14, in the illustrated embodiment, and includes a delay flip-flop 34, a NAND gate 36 and an AND gate 38. Alternative arrangements of logic elements could be used for the delay means 32, if desired. It should be noted that while the delay means 32 provides additional versatility to the timing generator of the present invention, it can be omitted if desired.

An input signal of suitable frequency and waveform is applied from the oscillator 16 to an input terminal 40 of FIG. 2, labeled "CLK", and thence to each of the stages 28 of the counter 14 and to the delay flip-flop 34. Also connected to each of the stages 28 is a terminal 42, to which a start signal may be applied from the start flip-flop 24. A similar terminal 44 applies a start signal to the delay flip-flop 34 from the start flip-flop 24.

As shown in FIG. 2, the output of the first stage 28 of the counter is connected to an output terminal 45 and to one input of the delay flip-flop 34, with the other input of said delay flip-flop being connected to the clock terminal 40. The output of the delay flip-flop 34 is connected to one input of the NAND gate 36, with the other input connected to a terminal 46, to which a CYCLE CONTROL signal is applied, to control whether or not the delay means 32 is effectively included in the circuitry of the counter 14 for a given operation, as will subsequently be described. The output of the NAND gate 36 is connected to one input of the AND gate 38, the other input of which is connected to the output of the first stage 28 of the counter 14. The output of the gate 38 is connected to one input of the second stage 28 of the counter 14 and to an output terminal 48.

The outputs of the second and subsequent stages 28 of the counter 14 are connected to counter output terminals 50 and to the inputs of the next succeeding stage 28 of the counter 14, except for the last stage in which, as previously mentioned, the complementary output, rather than the output, is connected back to the input of the first stage 28.

Figure 3:
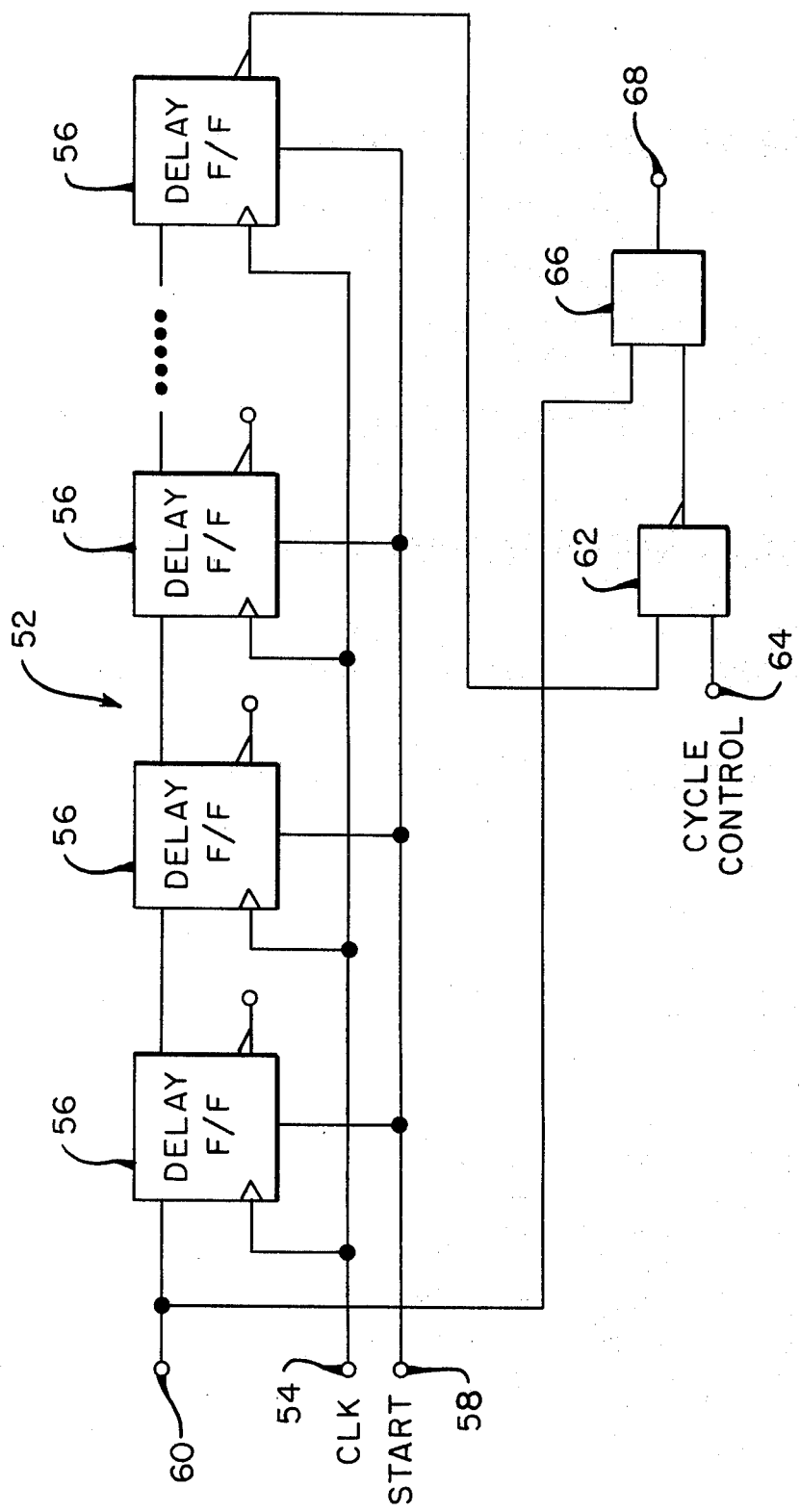
FIG. 3 is a block diagram showing a modified form of delay means.

Shown in FIG. 3 is a modified form of delay means, generally designated as 52, in which a delay of greater duration can be provided by the use of a plurality of delay flip-flops. A clock signal is applied from the oscillator 16 through a terminal 54 to each of a plurality of delay flip-flops 56. Similarly a start signal is applied from the start flip-flop 24 through a terminal 58 to each of the flip-flops 56. The output of the first stage 28 of the counter 14 is applied through a terminal 60 to the input of a first delay flip-flop 56. Succeeding flip-flops 56 can then be triggered in a well-known manner, each providing a predetermined delay, by connections from one flip-flop 56 to the next. The complementary output of the final flip-flop 56 is connected to one input of a NAND gate 62, the other input of which is connected to a terminal 64 to which a CYCLE CONTROL signal is applied, to control whether or not the delay means 52 is effectively included in the circuit of the counter 14 for a given operation, as will subsequently be described. The output of the NAND gate 62 is connected to one input of an AND gate 66, the other input of which is connected to the terminal 60 connected to the output of the first stage 28 of the counter 14. The output of the AND gate 66 is connected through a terminal 68 to the input of the second stage 28 of the counter 14 and may also provide an output function, if desired.

It will be obvious that the delay means 52 of FIG. 3 could be substituted, if desired, for the delay means 32 of FIG. 2, in the event that a different duration of delay is desired. It will also be obvious that the amount of delay can be adjusted by changing the number of delay flip-flops employed. In addition, it should be noted that the delay can be interposed between any two desired successive stages, and that more than one delay may be employed in a counter, if desired.

The above constitutes a general description of the organization of the circuit of the present invention in accordance with the showing of FIGS. 1-3 inclusive. For a more detailed description of the circuit elements and the interconnections, as well as the timing and waveforms associated therewith, reference may be had to the following explanation, together with the showings of FIGS. 4A, 4B, 6, 7, 8 and 9A to 9D inclusive.

In the following circuit description, all of the component-type designations will be those of Texas Instruments Inc. However, it will be obvious that equivalent components made by other manufacturers could also be used.

Referring now to FIG. 7, shown there is the Johnson counter 14, in the form of a quad flip-flop, which may be of type 74S175. The inputs and outputs of the various stages 1 to 12 inclusive are identified by the terms JC1 to JC12 inclusive and the complementary terms $\overline{JC1}$ to $\overline{JC12}$, respectively. It will be seen that for stages 3 to 11 inclusive, the output of one stage, such as JC3, is connected to the input of the next stage. The complementary output $\overline{JC12}$ is connected to the input of the first stage. The output of the first stage is connected to the input of the second stage, with a delay, such as the delay means 32, being connected between the output of the second stage and the input of the third stage.

Output of the counter 14 is initiated by a signal MA.F applied thereto from the start circuit 24, shown in FIG. 6, and the counter is clocked by the signal CLKOSC.G applied to it from the oscillator 16 (FIG. 8).

The start circuit 24 of FIG. 1, as shown in FIG. 6, includes a flip-flop 70, which may be of type 74S74, and an AND gate 73, which may be of type 74S08. One input of the AND gate 72 may be connected through terminal 74 to an external data processing system which controls the timing generator 12 of the present invention. The second input of the AND gate 72 is connected to the output of the AND gate 73, a first input of which is connected through terminal 76 to an external data processing system, and a second input of which is connected to the output terminal 120 on which the signal $\overline{CLRT.G}$ appears. The third input of the AND gate 72 is connected to the complementary output of the flip-flop 70. First and second inputs of the flip-flop 70 are connected to a terminal 78, which is held at +5 volts by a pull-up resistor (not shown). A third input of the flip-flop 70 is connected to the output of the AND gate 72, while the fourth input of the flip-flop 70 is connected to the external data processing system through the terminal 76. Appropriate signals from the external data processing system through terminals 74 and 76 cause the start signal MA.F to be produced by the flip-flop 70 and applied to the output terminal 80.

Included in the circuitry of FIG. 8 are an oscillator 16 and the delay means 32 of FIG. 2. The oscillator 16 may be of any suitable type, and in the illustrated embodiment oscillates at a frequency of 20 MHz. The output of the oscillator 16 is applied to one input of a NAND gate 82, which may be of type 74S00. The other input of said NAND gate is connected to a first terminal 84 to which a signal $\overline{CLRDIS}$ is applied from an external source, and to a second terminal 86 which is held at a +5-volt level by a pull-up resistor (not shown). The output of the NAND gate 82 is connected to one input of a second NAND gate 88, which may be of type 74S00, the other input of which is connected to a first terminal 90 to which a signal $\overline{EXTCLK}$ is applied from an external source, and to a second terminal 92 which is held at a +5-volt level by a pull-up resistor (not shown). The output of the NAND gate 88 provides the signal CLKOSC.G, which is applied to the counter 14 of FIG. 7, as previously described.

Figure 4A:
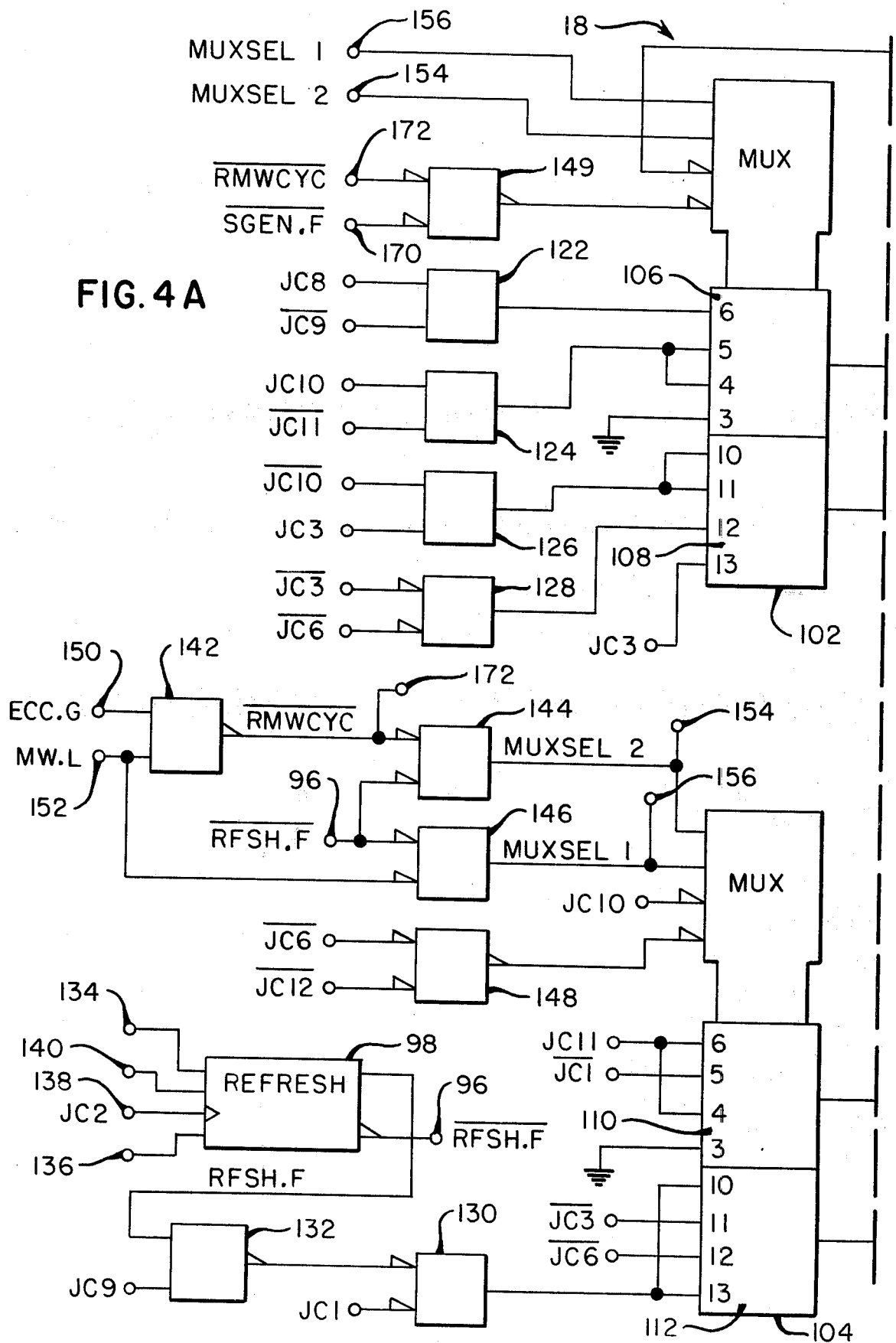
FIGS. 4A and 4B, taken together, constitute a circuit diagram showing the multiplexer, gating associated therewith, the cycle decoder and the enable flip-flop.

The signal CLKOSC.G is also applied to one input of the flip-flop 34, which may be of type 74S74. A second input of the flip-flop 34 is connected to a terminal 94 which is held at a +5-volt level by a pull-up resistor (not shown). A third input of the flip-flop 34 is connected to the output JC2 of the second stage of the counter 14 (FIG. 7), and a fourth input is connected to the output of the start flip-flop 24 (FIG. 6), on which appears the signal MA.F. The complementary output of the flip-flop 34 is connected to one input of the NAND gate 36, which may be of type 74S00, the other input of which is connected to a terminal 96, to which is applied a signal $\overline{RFSH.F}$ from a refresh flip-flop 98 (FIG. 4A). In the illustrated embodiment, the signal $\overline{RFSH.F}$ from the refresh flip-flop 98 is the CYCLE CONTROL signal applied to terminals 46 and 64 of FIGS. 2 and 3 respectively. The output of the NAND gate 36 is applied to one input of the AND gate 38, which may be of type 74S11, the other input of which is connected to output JC2 of the counter 14 (FIG. 7). The output of the AND gate 38 is connected to input JC2A of the third stage of the counter 14. It will thus be seen that the delay means 32 is interconnected between the second and third stages of the counter 14.

Figure 4B:
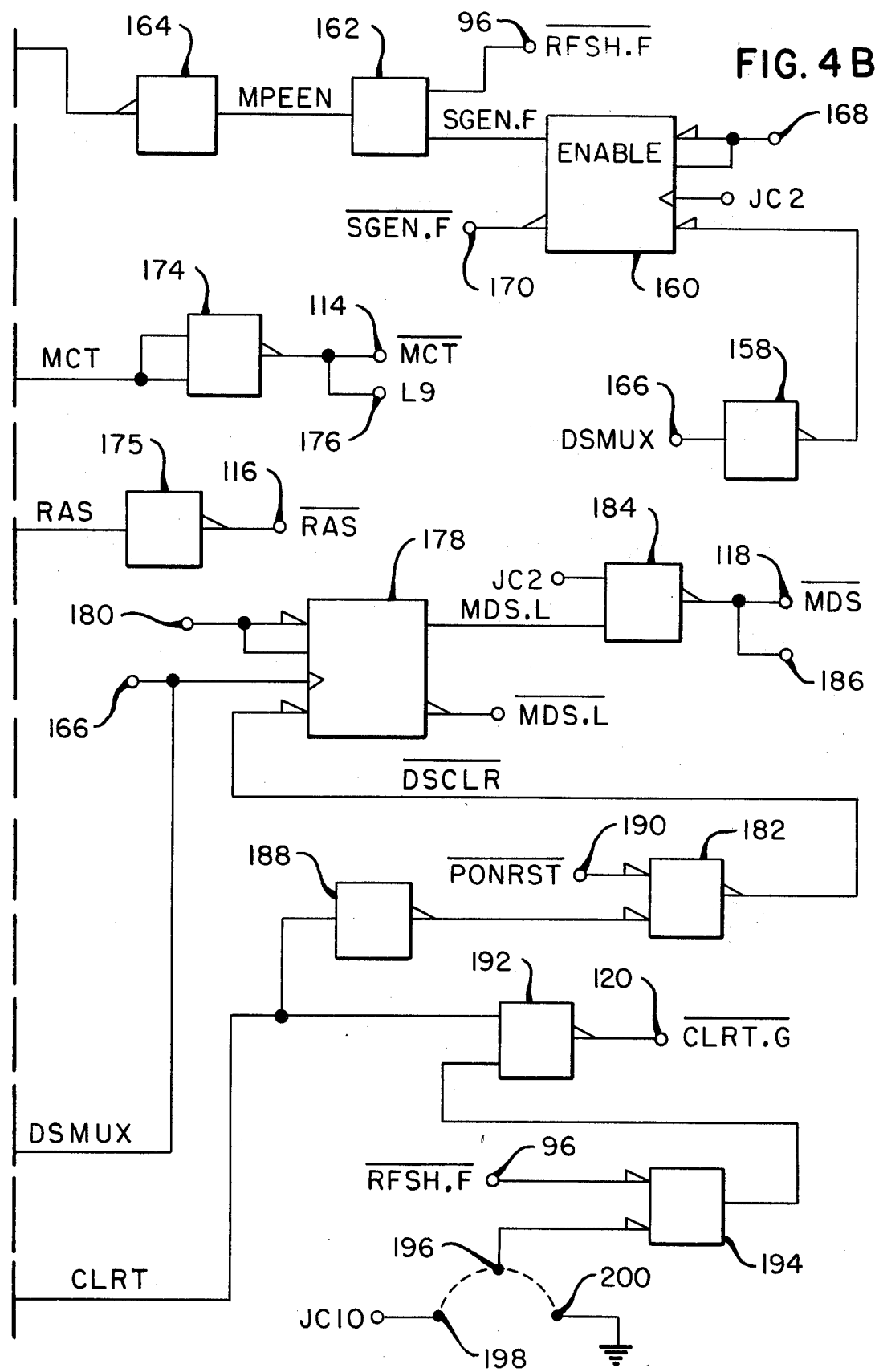

Referring now to FIGS. 4A and 4B, assembled as shown in FIG. 5, the multiplexer, represented as block 18 in FIG. 1, comprises two dual multiplex devices 102 and 104, each of which may be of type 74S153. The multiplex device 102 includes two multiplex sections 106, 108, and the multiplex device 104 includes two sections 110, 112. Each of these sections provides one of the timing pulse trains produced by the timing generator 12 in the illustrated embodiment of the invention. Obviously, the particular timing pulse trains disclosed are representative only, and different numbers of pulse trains of different frequency and waveform could be produced, if desired, by appropriate circuit modifications, well within the skill of one versed in the art. The section 106 produces a signal which is further modified to produce the signal $\overline{\text{MCT}}$ which appears on an output terminal 114; the section 108 produces a signal which is further modified to produce the signal $\overline{\text{RAS}}$ which appears on an output terminal 116; the section 110 produces a signal which is further modified to produce the signal $\overline{\text{MDS}}$ which appears on an output terminal 118; and the section 112 produces a signal which is further modified to produce the signal $\overline{\text{CLRT.G}}$ which appears on an output terminal 120. These waveforms are shown in FIGS. 9A to 9D inclusive as they appear in different modes of operation of the system with which the timing generator 12 is associated.

Examination of FIG. 4A will reveal that the outputs from the various stages of the counter 14 are applied to the various sections 106, 108, 110 and 112 of the multiplexer 18, either directly or through gating means. Counter outputs JC8 and $\overline{\text{JC9}}$ are applied through an AND gate 122, which may be of type 74S08, to section 106. Similarly, counter outputs JC10 and $\overline{\text{JC11}}$ are applied through an AND gate 124, which may be of type 74S08, to section 106. Another input of section 106 is connected to a base reference potential, shown as ground.

Counter outputs $\overline{\text{JC10}}$ and JC3 are applied through an AND gate 126, which may be of type 74S08, to section 108. Similarly, counter outputs $\overline{\text{JC3}}$ and $\overline{\text{JC6}}$ are applied through a NAND gate 128, which may be of type 74S00, to section 108. Counter output JC3 is applied directly to the section 108.

The inputs to section 110 include two inputs directly from counter output JC11, one input directly from counter output $\overline{\text{JC1}}$, and one input connected to a base reference potential, shown as ground.

In the case of section 112, one input is directly connected to counter output $\overline{\text{JC3}}$, one input is directly connected to counter output $\overline{\text{JC6}}$, and two inputs are connected to the output of a NAND gate 130, which may be of type 74S00.

One of the inputs to the NAND gate 130 is taken directly from counter output JC1, while the other input is connected to the output of a NAND gate 132, which may also be of type 74S00. One input to the NAND gate 132 is taken directly from counter output JC9, while the other input is a signal RFSH.F, taken from the output of the refresh flip-flop 98.

The refresh flip-flop 98 also provides a complementary output signal $\overline{\text{RFSH.F}}$ on the terminal 96, as has previously been described. First and second inputs of the flip-flop 98 are connected to terminals 134 and 136 which are held at a +5-volt level by a pull-up resistor (not shown). A third input is connected through terminal 138 to the counter 14 output JC2. A fourth input is connected through a terminal 140 to the external data processing system, and a signal is applied to this terminal when the external system desires to initiate a "refresh" operation.

As was briefly described in connection with FIG. 1, control of the multiplexer 18 to provide a desired combination of the appropriate waveforms $\overline{\text{RAS}}$, $\overline{\text{MCT}}$, $\overline{\text{MDS}}$ and $\overline{\text{CLRT.G}}$ on the terminals 114, 116, 118 and 120 in connection with a selected mode of operation is accomplished by the cycle decoder 22, which, as shown in FIG. 4A, includes NAND gates 142, 144 and 146. The gate 142 may be of type 7400. Its two inputs are connected through terminals 150 and 152 to signal sources in the external data processing system, which are capable of selecting the particular timing cycle desired at a given time. A signal ECC.G, relating to an error correction operation, may be applied to the terminal 150; and a signal MW.L, relating to a memory write operation, may be applied to the terminal 152.

The output of the gate 142 is applied to a terminal 172 and to one input of the NAND gate 144, which may be of type 7400. The other input of the gate 144 is connected through the terminal 96 to the complementary output of the refresh flip-flop 98, on which the signal $\overline{\text{RFSH.F}}$ appears. The output of the gate 144 is connected to one input of the multiplex devices 102 (through the terminal 154) and 104 for providing a signal MUXSEL2 used in selection of the outputs from multiplex sections 106, 108, 110 and 112.

Signals MW.L and $\overline{\text{RFSH.F}}$ are applied through terminals 152 and 96 to the inputs of the NAND gate 146, which may be of type 7400. The output of this gate, on which the signal MUXSEL1 appears, is connected to multiplex devices 102 (through terminal 156) and 104 for output selection purposes.

Referring to FIGS. 4A and 4B, the enable circuit represented by block 26 in FIG. 1 includes AND gates 148 and 149, an inverter 158, which may be of type 74S04; a flip-flop 160, which may be of type 74S74; an AND gate 162, which may be of type 74S08; and an inverter 164 which may be of type 74S04. The output signal DSMUX from section 110 of the multiplexer 18 is applied through terminal 166 to the input of the inverter 158, which inverts said signal and applies it to one input of the flip-flop 160. A second input to said flip-flop is connected to the output JC2 of the counter 14 (FIG. 7), while third and fourth outputs are connected to a terminal 168 which is held at a +5-volt level by a pull-up resistor (not shown). A complementary output signal $\overline{\text{SGEN.F}}$ from the flip-flop 160 is applied to a terminal 170, while the output signal SGEN.F is applied to one input of the AND gate 162, the other input of which is connected through the terminal 96 to the complementary output of the refresh flip-flop 98, which produces the signal $\overline{\text{RFSH.F}}$. The output of the AND gate 162 is applied to the inverter 164, which inverts the signal and applies it to an enabling input of the multiplex device 102.

The AND gate 149, which may be of type 74S08, has inputs connected to terminals 170 and 172, through which are applied signals $\overline{\text{SGEN.F}}$ and $\overline{\text{RMWCYC}}$, respectively, from the enable flip-flop 160 and the NAND gate 142. The output of the AND gate 149 is connected to one of the enabling inputs of the multiplex device 102.

Signals $\overline{\text{JC6}}$ and $\overline{\text{JC12}}$ are applied from the counter 14 (FIG. 7) to the inputs of the AND gate 148, which may be of type 74S08. The output of this gate is connected to an enabling input of the multiplex device 104.

Also connected to an enabling input of the multiplex device 104 is the output $\overline{\text{JC10}}$ from the counter 14.

The output of the section 106 of the multiplex device 102 is inverted by a NAND driver 174, which may be of type 7438, to provide output signal $\overline{\text{MCT}}$ at terminal 114. A terminal 176, connected to the terminal 114, is held at a +5-volt level by a pull-up resistor (not shown).

The output of the section 108 of the multiplex device 102 is inverted by an inverter 175, which may be of type 74S04, to provide output signal $\overline{RAS}$ at terminal 114.

The output of the section 110 of the multiplex device 104 is connected through the terminal 166 to one input of a flip-flop 178 which may be of type 74S74. Second and third inputs of the flip-flop 178 are connected to a terminal 180 which is held at a +5-volt level by a pull-up resistor (not shown). A signal $\overline{DSCLR}$ is applied to a fourth input of the flip-flop 178 from an AND gate 182, which will subsequently be described. The flip-flop 178 provides an output MDS.L and a complementary output $\overline{MDS.L}$.

The output MDS.L provides one of two inputs to a NAND driver 184, which may be of type 7438. The other input to the NAND driver 184 is the signal JC2, applied from an output of the counter 14. The output of the driver 184 is signal $\overline{MDS}$, applied to the terminal 118. A terminal 186, connected to the terminal 116, is held at a +5-volt level by a pull-up resistor (not shown).

The output CLRT of the section 112 of the multiplex device 104 is applied in a first circuit path to the input of an inverter 188, which may be of type 74S04, the output of which is connected to one input of the AND gate 182 which may be of type 74S08. A second input to the gate 182 consists of a signal $\overline{PONRST}$ from the external data processing system, applied through a terminal 190. It will be recalled that the output of the gate 182 is connected to one input of the flip-flop 178.

The output CLRT of the section 112 of the multiplex device 104 extends in a second circuit path to one input of a NAND gate 192, which may be of type 74S00. The output of the gate 192 appears at the terminal 120 as the signal $\overline{CLRT.G}$. A second input to the gate 192 consists of the output of a NAND gate 194, which may be of type 74S00. A first input to this gate consists of the signal $\overline{RFSH.F}$, applied through the terminal 96, and a second input is connected to a terminal 196 which may be selectively connected by means of a switch, a jumper, or other suitable means, either to a terminal 198 to which the output JC10 from the counter 14 is connected, or to a terminal 200 connected to a base reference potential or ground.

A description of the operation of the circuits of FIGS. 1 to 3, 4A, 4B and 6 to 8 inclusive will now be made with reference to the waveforms of FIGS. 9A to 9D inclusive.

As previously stated, the counter 14 (FIGS. 1, 2 and 7) is a multi-stage shift register having the complement output of the last stage fed back to the first stage input. It is clocked by the free-running oscillator 16, and its operation is initiated by a signal MA.F from the start flip-flop 24 (FIGS. 1 and 6), in response to a predetermined combination of signals applied to the terminals 74 and 76. Each stage has a true output and a complementary output, JC1 to JC12 and $\overline{JC1}$ to $\overline{JC12}$, respectively, which are utilized in the circuitry of the present invention to produce the desired timing sequences. When operation of the counter is commenced by the start flip-flop 24, the outputs of the stages are sequentially clocked to a high logic level by the signal CLKOSC.G from the oscillator 16 and the gates 82, 88, with the complementary outputs of the stages being sequentially clocked to a low logic level. Since the last stage complement is fed back to the first stage input, the clocking high of the last stage creates a low on the input of the first stage, and its true output JC1 is clocked low. This sequence is continued until the counter is disabled.

A delay between successive stages can be selectively added to the pulse train from the counter 14 by incorporation into the circuit of the delay means 32. It will be noted that in the block diagram of FIG. 2, the delay means 32 is connected between the first and second stages of the counter 14, while in the detailed circuitry of FIGS. 7 and 8, the delay means is connected between the second and third stages. Obviously, the delay means can be connected between any two successive stages of the counter, and delays may be interposed between more than one pair of successive stages, if desired. Each delay means can add a desired amount of delay time between stages, by utilizing a plurality of serially-connected delay flip-flops, as shown in FIG. 3.

The delay provided by the delay means 32 is added into the pulse train generated by the counter 14 if the delay means 32 is functionally incorporated into the counter circuitry. In the illustrated embodiment, the delay is included in all modes of operation exdept the refresh mode, during which it is disabled by a low logic level signal $\overline{RFSH.F}$ applied to the terminal 96 associated with the NAND gate 36. This signal is generated by the refresh flip-flop 98 in response to a signal from the external data processing system applied to the terminal 140.

Let it first be assumed that the timing generator of the present invention is operating in some mode other than the refresh mode, so that the signal $\overline{RFSH.F}$ on the terminal 96 is at a high logic level. The signal MA.F from the start flip-flop 24 is also at a high logic level. A clock signal CLKOSC.G triggers the second stage of the counter 14, so that the output JC2 goes to a high logic level. At this time, the complementary output of the flip-flop 34, which is applied to one input of the gate 36, is high, as is the signal $\overline{RFSH.F}$ applied to the other input. The output of said gate, which is applied to one input of the AND gate 38, is low, which means that the output JC2A of said gate is also low. Therefore, the next clock pulse CLKOSC.G cannot advance the counter 14 to its third stage.

This next clock pulse CLKOSC.G, when applied to the flip-flop 34, causes said flip-flop to be triggered, so that its complementary output which is applied to one input of the gate 36 causes the output of said gate to shift to a high logic level. Since both inputs to the gate 38 are then high, the output JC2A goes to a high logic level, and on the next following clock pulse CLKOSC.G, the counter 14 is shifted to its third stage. A delay of one clock pulse time has thus been interposed between the second and third stages of the counter 14.

In the event that the timing generator of the present invention is operating in the refresh mode, the signal $\overline{RFSH.F}$ applied to the terminal 96 associated with one input of the gate 36 will be at a low logic level, and the output of said gate will be at a high logic level regardless of the condition of the flip-flop 34. Therefore, the corresponding input to the AND gate 38 will be high, and as soon as the signal JC2 goes high, this will be immediately passed through the gate 38 to shift the signal JC2A to a high logic level, so that the counter 14 will shift from its second stage to its third stage without any delay being interposed therebetween.

As mentioned above, the true outputs of the counter 14, due to the complementary connection between the last and first stages, will each shift successively to a low logic state during a second cycle of operation following a first cycle in which these outputs successively shifted to a high logic state. During this second cycle, no delay is interposed between the second and third stages by the delay means 32. As the signal JC2 input into the AND gate 38 shifts to a low logic state, the output JC2A immediately follows, also shifting to a low state, and causing the third stage of the counter 14 to be triggered on the next clock pulse, without delay.

Various control means are associated with the counter 14 in order to initiate and terminate its operation and to cause the desired pulse train to be produced in accordance with the mode of operation selected for performance by the data processing system with which the timing generator is associated.

A first control is provided by the start flip-flop 24 of FIG. 1, the circuit of which is shown in FIG. 6. Appropriate external control signals are applied to terminals 74 and 76, and are gated through the AND gates 72 and 73 to trigger the flip-flop 70 to produce an output signal MA.F, which is applied to the counter 14 and the delay flip-flop 34 to initiate operation of the timing generator. Said flip-flop is reset under control of the output signal $\overline{\text{CLRT.G}}$ and the external signal applied to the terminal 76 at the completion of the desired operation.

While for certain pulse train sequences, it would be possible to take signals directly off the various stage outputs of the counter 14 and to apply them to a utilizing device, a much greater versatility and selection can be obtained by connecting the various counter stage outputs in predetermined combinations and then selecting a desired one or more of these combinations to provide a timing pulse train cycle for a particular function.

To this end, in the illustrated embodiment, the true and complementary outputs of the various counter output stages are connected either directly or through gating means to the multiplexer 18 (FIGS. 1 and 4A). A plurality of outputs from the multiplexer provide a group of timing signals $\overline{\text{MCT}}$, $\overline{\text{RAS}}$, $\overline{\text{MDS}}$ and $\overline{\text{CLRT.G}}$ in the illustrated embodiment, on terminals 114, 116 118 and 120 respectively, for use by various elements of the external data processing system which the timing generator 12 of the present invention serves. Different waveforms for these signals are provided, in accordance with different modes of operation which may be selected. In FIGS. 9A to 9D inclusive, the waveforms for these signals are shown in four different modes of operation, namely: write cycle, read cycle, read/modify/write cycle, and refresh cycle. Time is represented in FIGS. 9A to 9D inclusive by the abscissa of these waveforms, and the points in time at which the various counter stage outputs and the delay means output are shifted in logic level are designated. It will be noted that the delay means output JC2A is shown for each cycle except the refresh cycle of 9D, in which the delay means is disabled, as has been previously described.

Selection of the desired mode or cycle is accomplished by the cycle decoder 22 of FIG. 1, which includes gates 142, 144 and 146, as shown in FIG. 4A. An error correction code signal ECC.G applied through the terminal 150 to the gate 142 from an external source, and a memory write signal MW.L applied through the terminal 152 to the gates 142 and 146, in addition to the refresh signal $\overline{\text{RFSH.F}}$ applied through the terminal 96 to the gate 146, determine the timing cycle to be output from the multiplex sections 106, 108, 110 and 112. The output signals MUXSEL1 and MUXSEL2 from the gates 146 and 144 respectively are each applied to both of the multiplex devices 102 and 104 for selection of the desired timing cycle or mode. In the illustrated embodiment of the invention, a write cycle will be selected if both of the signals MUXSEL1 and MUXSEL2 are at a low logic level; a read cycle will be selected if the signal MUXSEL1 is high but not the signal MUXSEL2; a read/modify/write cycle will be selected if the signal MUXSEL1 is at a low logic level and the signal MUXSEL2 is at a high logic level; and a refresh cycle will be selected if both of the signals MUXSEL1 and MUXSEL2 are at a high logic level.

Referring back to the signals ECC.G and MW.L applied to the terminals 150 and 152, it may be noted that a write cycle will be selected if the signal ECC.G is at a low logic level and the signal MW.L at a high logic level; a read cycle will be selected if the signal MW.L is low; a read/modify/write signal will be selected if the signals ECC.G and MW.L are both high; and a refresh signal will be selected if the signal $\overline{\text{RFSH.F}}$ is low.

As shown in FIG. 4A, the various input pins of the multiplexer sections 106 and 110 are designated 3, 4, 5, 6 and the various input pins of the multiplexer sections 108 and 112 are designated 10, 11, 12, 13. Corresponding inputs in each section are selected in accordance with the logic levels of the signals MUXSEL1 and MUXSEL2, and the signals applied to the selected inputs provide the outputs from the respective sections. The various combinations are tabulated below:

| MUXSEL1 | MUXSEL2 | MODE | MUX PINS |
|---------|---------|------|----------|
| 0 | 0 | WRITE | 6,10 |
| 1 | 0 | READ | 5,11 |
| 0 | 1 | READ/MOD/WRITE | 4,12 |
| 1 | 1 | REFRESH | 3,13 |

Thus if, for example, a write mode is selected, both of the signals MUXSEL1 and MUXSEL2 will be at a low logic level. The input signal appearing at pin 6 of section 106 will provide the output for the signal MCT; the input signal appearing at pin 10 of section 108 will provide the output for the signal RAS; the input signal appearing at pin 6 of section 110 will provide the output for the signal DSMUX; and the input signal appearing at pin 10 of section 112 will provide the output for the signal CLRT.

Figure 9A:
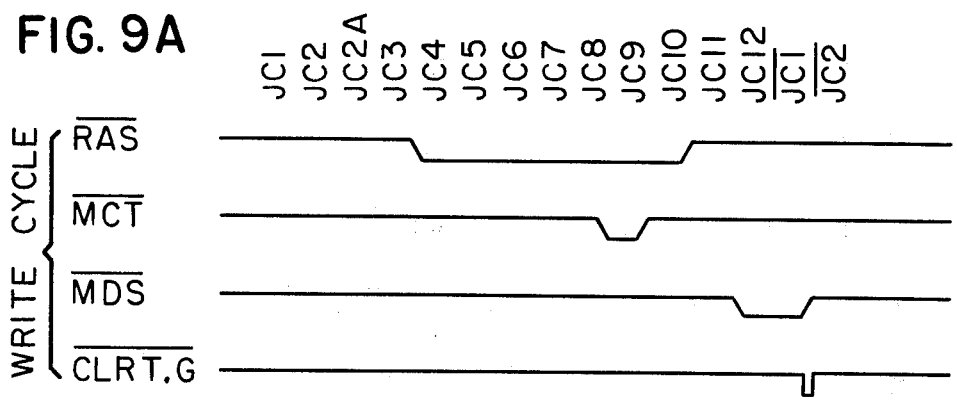
FIGS. 9A, 9B, 9C and 9D show a plurality of waveforms generated by the timing generator of the present invention in various modes of operation.
Figure 9B:
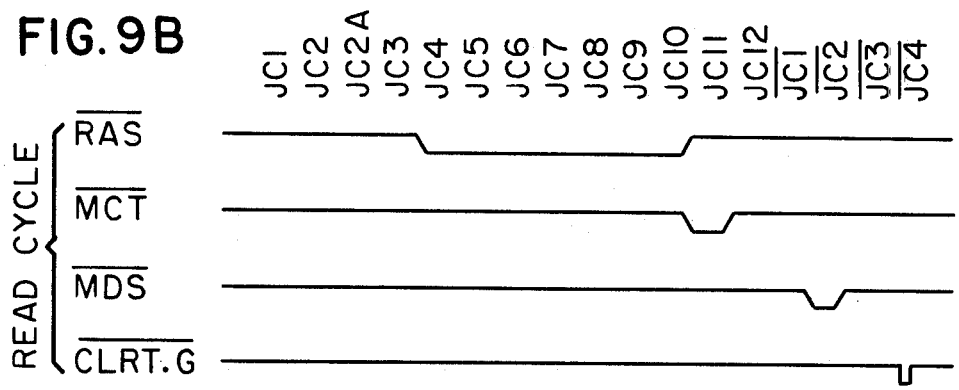
Figure 9C:
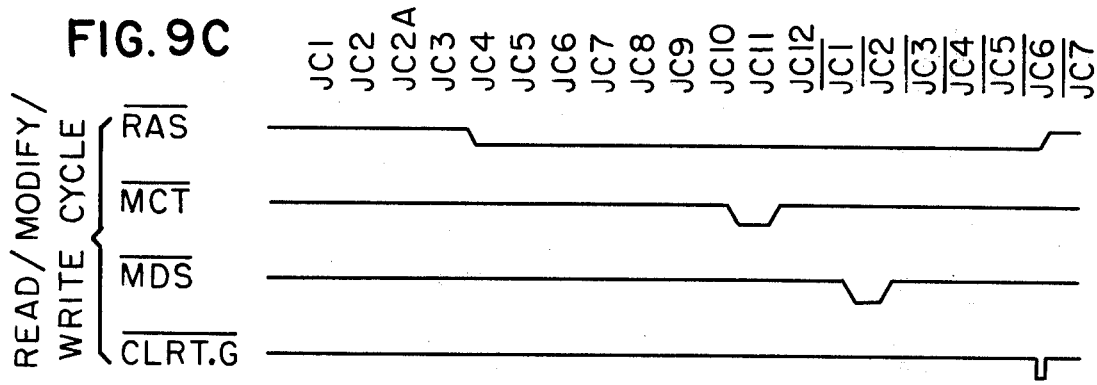
Figure 9D:
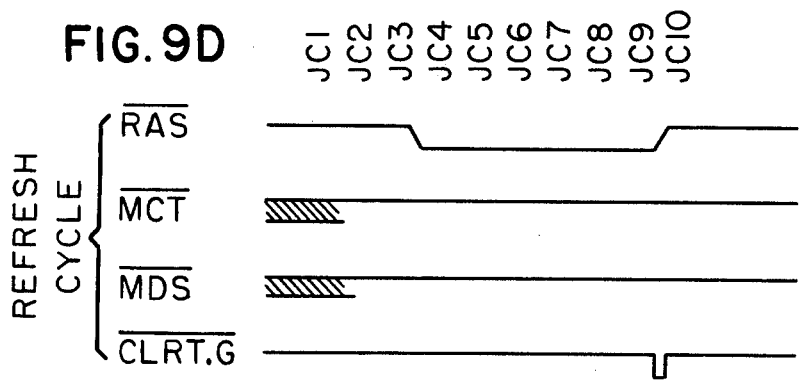

It will be seen that the counter 14 outputs which are connected to the input pins of the multiplexer sections determine the various outputs from the multiplexer sections, and thus the output signals appearing at the terminals 114, 116, 118 and 120. For example, the counter outputs JC8 and $\overline{\text{JC9}}$ are connected through the gate 122 to the pin 6 of the multiplexer section 106. Therefore, when pin 6 of the section 106 is selected by the combination of signals MUXSEL1 and MUXSEL2, the signal MCT will shift from a low logic level to a high logic level at the time that the eighth stage of the counter 14 is triggered to shift output JC8 to a high level, and will shift from the high logic level back to a low logic level at the time that the ninth stage of the counter is triggered to shift output $\overline{\text{JC9}}$ to a low level. Since the signal MCT is inverted by the gate 174 to produce the signal $\overline{\text{MCT}}$, that signal, as represented in FIG. 9A, shows a shift from high to low at JC8 and a shift from low to high at JC9.

A similar analysis can be made for the circuitry associated with the other input pins of the various sections. It will be noted that in certain instances, the same circuitry is applied to more than one pin, and that in certain other instances the input pins are directly connected to counter outputs, or to a base reference potential, shown as ground.

The inputs to pins 1 and 15 of the multiplex devices 102 and 104 are enable inputs. The signal levels on these pins control whether or not the outputs from the sections 106, 108, 110 and 112 are enabled or blocked at a given time. In the illustrated embodiment, the signal on pin 1 of the devices 102 and 104 controls the outputs of sections 106 and 110, while the signal on pin 15 of the devices 102 and 104 controls the outputs of sections 108 and 112. The enable inputs function to prevent unwanted signals generated by the counter 14 from appearing on any of the output terminals 114, 116, 118 and 120 before the proper time for commencement of the various timing cycles, or after said timing cycles are properly concluded. One particular problem solved by the enable inputs is the possible appearance of spurious signals on the output terminals caused by termination of operation of the counter 14. It has been found that if one input to a gate is an active high counter output and has been clocked high and a second input to said gate is an active low counter output and has been clocked low, when the counter is disabled the active low output will go high before the active high output goes low. This creates an undesired spike on the output of the gate. The enable input serves to block the multiplexer output before such a spike is applied thereto, thus avoiding a spurious output signal.

As shown in FIG. 4B, the enable flip-flop 160 is triggered on by the output JC2 from the counter 14 near the beginning of a cycle of counter operation, and is reset by a DSMUX signal from multiplexer section 110, which does not become active until after the timing cycles controlled by the enable input associated with the flip-flop 160 have concluded. It will be seen that the DSMUX signal is inverted by the inverter 158 and applied to the reset terminal of the flip-flop 160. The output SGEN.F signal from the flip-flop 160 is ANDED with signal $\overline{\text{RFSH.F}}$ in the gate 162, inverted by the inverter 164, and applied to pin 1 of the multiplex device 102 to control the signal MCT which is output from the multiplexer section 106.

In a similar manner, the complementary output signal $\overline{\text{SGEN.F}}$ from the enable flip-flop 160 is ANDED in the gate 149 (FIG. 4A) with the signal $\overline{\text{RMWCYC}}$ from the gate 142 (FIG. 4A), and the output from the gate 149 is applied to pin 15 of the multiplexer device 102 to control the signal RAS which is output from the multiplexer section 108.

The enable input pin 1 of the multiplexer section 104 is directly connected to the counter output $\overline{\text{JC10}}$, and the output signal DSMUX of section 110 is therefore enabled only during the time that $\overline{\text{JC10}}$ is high.

The enable input pin 15 of the multiplexer section 104 is connected to the output of the AND gate 148, the inputs of which are connected to the counter outputs $\overline{\text{JC6}}$ and $\overline{\text{JC12}}$. The output signal CLRT is therefore enabled in accordance with the combination of these signals established by the gate 148.

The outputs MCT, RAS, DSMUX and CLRT from the multiplexer sections 106, 108, 110 and 112 respectively are further modified in accordance with specific system requirements in order to provide the signals MCT, $\overline{\text{RAS}}$, $\overline{\text{MDS}}$ and $\overline{\text{CLRT.G}}$ shown in FIGS. 9A to 9D inclusive at the output terminals 114, 116, 118 and 120 respectively. These signals clearly could be used as they come from the multiplexer sections, or with other modifying circuitry, if desired, in order to meet different circuit timing requirements. The particular signals and the waveforms thereof shown in the present application have been developed to meet particular circuit requirements.

The signals MCT and RAS are inverted by gates 174 and 175 (FIG. 4B) in order to provide signals $\overline{\text{MCT}}$ and $\overline{\text{RAS}}$.

The signal DSMUX provides one input to the flip-flop 178 (FIG. 4B), which is also controlled by the signal $\overline{\text{DSCLR}}$, derived from the CLRT signal output from the multiplexer section 112. The output MDS.L of the flip-flop 178 provides one input to the NAND driver 184, with the output JC2 from the counter 14 providing the other input. The signal $\overline{\text{MDS}}$ is taken from the output of said gate.

The $\overline{\text{CLRT.G}}$ signal is taken from the output of the NAND gate 192, one input of which is the signal CLRT, and the other input of which is the output of the NAND gate 194, which receives inputs from the terminal 96 to which is applied the $\overline{\text{RFSH.F}}$ signal, and the terminal 196, which can be manually connected either to the counter output JC10 or to the base reference potential at terminal 200.

While the form of the invention illustrated and described herein is particularly adapted to fulfill the objects aforesaid, it is to be understood that other and further modifications within the scope of the following claims may be made without departing from the spirit of the invention.

What is claimed is:

1. Control signal generating means capable of generating a plurality of different timing cycles comprising:
   multi-stage shift register means having outputs from a plurality of said stages;
   at least one selectively effective delay means interposed between successive stages of said shift register means;
   start means coupled to said shift register means for initiating and disabling operation of said shift register means;
   means for clocking said multi-stage shift register means;
   multiplexer means to which a plurality of said outputs from various stages of said shift register means are applied and from which said timing cycles are taken; and
   selection means for controlling said multiplexer means to select desired outputs from the shift register means for application to a utilizing device.

2. The generating means of claim 1 in which the complement output of the final stage of the shift register means is applied to the input of the first stage.

3. The generating means of claim 1 including switching means for selectively switching said selectively effective delay means into and out of operative coupling relation to the shift register means.

4. The generating means of claim 1 in which said selectively effective delay means comprises at least one flip-flop.

5. The generating means of claim 1 in which the selectively effective delay means comprises at least one flip-flop plus gating means for selectively switching the delay means into and out of operative coupling relation to the shift register means.

6. The generating means of claim 1 in which the selectively effective delay means comprises a plurality of flip-flops connected in series relationship.

7. The generating means of claim 1 in which said multiplexer means includes a plurality of multiplexers.

8. The generating means of claim 1, also including gating means interposed between the shift register means and the multiplexer means to control the transmission of signals from said shift register means to said multiplexer means.

9. The generating means of claim 1, also including start means coupled to said shift register means for initiating operation of the control signal generating means.

10. Control signal generating means capable of generating a plurality of different timing cycles comprising:
multi-stage shift register means;
at least one selectively effective delay means interposed between successive stages of said shift register means;
start means coupled to said shift register means for initiating and disabling operation of said shift register means;
means for clocking said multi-stage shift regiser means;
multiplexer means to which a plurality of outputs from various stages of said shift register means are applied and from which said timing cycles are taken;
selection means for controlling said multiplexer means to select desired outputs from the shift register means for application to a utilizing device; and
an enable means operatively coupled to said multiplexer means for interrupting the output signals from said shift register means after the desired output has been terminated and before the multi-stage shift register means is disabled.

11. The generating means of claim 10 in which the enable means is controlled by said shift register means and said multiplexer means.

12. Control signal generating means comprising:
multi-stage shift register means having an output coupled to at least certain stages thereof, from which control signals may be taken, the complement of the output of the final stage of the shift register means being applied to the input of the first stage;
start means coupled to said shift register means for initiating operation of the control signal generating means;
oscillator means for clocking said shift register means;
at least one delay means interposed between successive stages of said shift register means, said delay means including flip-flop means and gating means, said gating means being connected to one of the stages of said shift register means to which said delay means is coupled, whereby due to the complementary connection between the final stage and the first stage of said shift register means opposite binary values are applied to said gating means from said stage during successive operations of said shift register means, one of said binary values causing said delay means to be operative in imposing a delay between said successive stages, and the other binary value being operable to exclude the effect of said delay means; and
means to control whether or not said delay means is operable to impose an additional delay between successive stages of said shift register means.

13. The signal generating means of claim 12 including multiplexer means to which the outputs from the shift register stages are coupled.

14. The signal generating means of claim 13 including enable means operatively coupled to said multiplexer means for interrupting output signals from the shift register means.

15. Control signal generating means capable of generating a plurality of different timing cycles comprising:
multi-stage shift register means having the complement output of the final stage thereof applied to the input of the first stage;
start means coupled to said multi-stage shift register means for initiating and disabling operation of the multi-stage shift register means;
oscillator means for clocking said multi-stage shift register means;
at least one delay means interposed between successive stages of said shift register means, said delay means including at least one flip-flop plus gating means for selectively switching the delay means into and out of operative coupling relation to the shift register means;
multiplexer means to which a plurality of outputs from various stages of said shift register means are applied and from which said timing cycles are taken;
enable means operatively coupled to said multiplexer means for interrupting the output signals from said shift register means after the desired output has been terminated and before the multi-stage shift register means is disabled, said enable means being controlled by said shift register means and said multiplexer means;
gating means interposed between the shift register means and the multiplexer means to control the transmission of signals from said shift register means to said multiplexer means; and
selection means for controlling said multiplexer means to select desired outputs from the shift register means for application to a utilizing device.

16. The control signal generating means of claim 15 including means coupling an output of said multiplexer means to said start means for resetting said start means to disable said multi-stage shift register means.

17. Control signal generating means capable of generating a plurality of different timing cycles comprising:
multi-stage shift register means having outputs from a plurality of said stages and having the complement output of the final stage thereof applied to the input of the first stage;
start means coupled to said multi-stage shift register means for initiating operation of the shift register means;
oscillator means for clocking said multi-stage shift register means;
at least one delay means interposed between successive stages of said shift register means, said delay means including at least one flip-flop plus gating means for selectively switching the delay means into and out of operative coupling relation to the shift register means;

multiplexer means to which a plurality of said outputs from various stages of said shift register means are applied and from which said timing cycles are taken;

gating means interposed between the shift register means and the multiplexer means to control the transmission of signals from said shift register means to said multiplexer means; and selection means for controlling said multiplexer means to select desired outputs from the shift register means for application to a utilizing device.

* * * * *